United States Patent
Matsuo

(10) Patent No.: US 10,319,730 B2
(45) Date of Patent: Jun. 11, 2019

(54) MEMORY DEVICE HAVING A PLURALITY OF FIRST CONDUCTIVE PILLARS PENETRATING THROUGH A STACKED FILM

(71) Applicant: TOSHIBA MEMORY CORPORATION, Minato-ku, Tokyo (JP)

(72) Inventor: Kouji Matsuo, Ama Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/927,318

(22) Filed: Mar. 21, 2018

(65) Prior Publication Data
US 2019/0096900 A1  Mar. 28, 2019

(30) Foreign Application Priority Data
Sep. 22, 2017  (JP) ................................ 2017-181980

(51) Int. Cl.
*H01L 27/11548* (2017.01)
*H01L 27/11556* (2017.01)
(Continued)

(52) U.S. Cl.
CPC .... *H01L 27/11548* (2013.01); *H01L 23/5226* (2013.01); *H01L 25/18* (2013.01);
(Continued)

(58) Field of Classification Search
CPC ......... H01L 27/11582; H01L 27/11556; H01L 27/1157; H01L 23/528; H01L 29/66833;
(Continued)

(56) References Cited

U.S. PATENT DOCUMENTS

| 8,633,535 B2 | 1/2014 | Matsuo et al. |
| 8,952,441 B2 | 2/2015 | Sakuma et al. |

(Continued)

*Primary Examiner* — Khiem D Nguyen
(74) *Attorney, Agent, or Firm* — Foley & Lardner LLP

(57) ABSTRACT

A memory device according to an embodiment includes: a stacked film having a plurality of semiconductor films, and a plurality of insulating films each provided between the semiconductor films; a first electrode provided above the stacked film; a second electrode provided above the stacked film; a plurality of first conductive pillars penetrating through the stacked film and having one end electrically connected to the first electrode and another end not connected and positioned below the stacked film; a plurality of memory cells each provided between each of the first conductive pillars and each of the semiconductor films; a plurality of second conductive pillars electrically connected to each of the semiconductor films and the second electrode; a peripheral circuit board provided above the first electrode and the second electrode; a third electrode provided between the first electrode and the peripheral circuit board, the third electrode electrically connected to the first electrode; a fourth electrode provided between the second electrode and the peripheral circuit board, the fourth electrode electrically connected to the second electrode; and a transistor electrically connected to the third electrode or the fourth electrode, the transistor provided in the peripheral circuit board.

10 Claims, 4 Drawing Sheets

(51) Int. Cl.
  *H01L 23/522* (2006.01)
  *H01L 27/11582* (2017.01)
  *H01L 25/18* (2006.01)
  *H01L 27/11575* (2017.01)
  *H01L 23/00* (2006.01)

(52) U.S. Cl.
  CPC .. *H01L 27/11556* (2013.01); *H01L 27/11575* (2013.01); *H01L 27/11582* (2013.01); *H01L 24/08* (2013.01); *H01L 2224/08146* (2013.01); *H01L 2924/1431* (2013.01); *H01L 2924/14511* (2013.01)

(58) Field of Classification Search
  CPC ........... H01L 23/5226; H01L 27/11548; H01L 27/1151; H01L 27/11575; H01L 27/11578; H01L 27/11551; H01L 27/11573
  See application file for complete search history.

(56) References Cited

U.S. PATENT DOCUMENTS

| | | | |
|---|---|---|---|
| 9,019,739 B2 | 4/2015 | Park et al. | |
| 9,558,945 B2 | 1/2017 | Fukuzumi et al. | |
| 2009/0057750 A1* | 3/2009 | Takashima | H01L 21/28273 257/321 |
| 2012/0181602 A1* | 7/2012 | Fukuzumi | H01L 27/0688 257/326 |
| 2012/0273747 A1* | 11/2012 | Saitoh | H01L 21/823431 257/5 |
| 2013/0121081 A1* | 5/2013 | Kito | G11C 16/0483 365/185.18 |
| 2013/0307047 A1* | 11/2013 | Sakuma | H01L 29/66825 257/316 |
| 2015/0069568 A1* | 3/2015 | Yamane | H01L 27/10 257/499 |
| 2015/0214103 A1* | 7/2015 | Matsuda | H01L 27/11575 257/314 |

* cited by examiner

MEMORY DEVICE HAVING A PLURALITY OF FIRST CONDUCTIVE PILLARS PENETRATING THROUGH A STACKED FILM

CROSS-REFERENCE TO RELATED APPLICATION

This application is based upon and claims the benefit of priority from Japanese Patent Application No. 2017-181980, filed on Sep. 22, 2017, the entire contents of which are incorporated herein by reference.

FIELD

Embodiments described herein relate generally to a memory device.

BACKGROUND

Development of a large-capacity nonvolatile memory has been actively carried out. With this type of memory, low voltage/low current operation, high speed switching, and miniaturization and high integration of a memory cell can be achieved.

To perform reading and writing of data to the large-capacity nonvolatile memory, a memory cell and a peripheral circuit including a transistor are used in combination. In a case where the memory cell is connected to the peripheral circuit by wiring disposed below the memory cell, a structure thereof is not simple, whereby it becomes difficult to provide a memory at a low cost.

DETAILED DESCRIPTION

Figure 1:
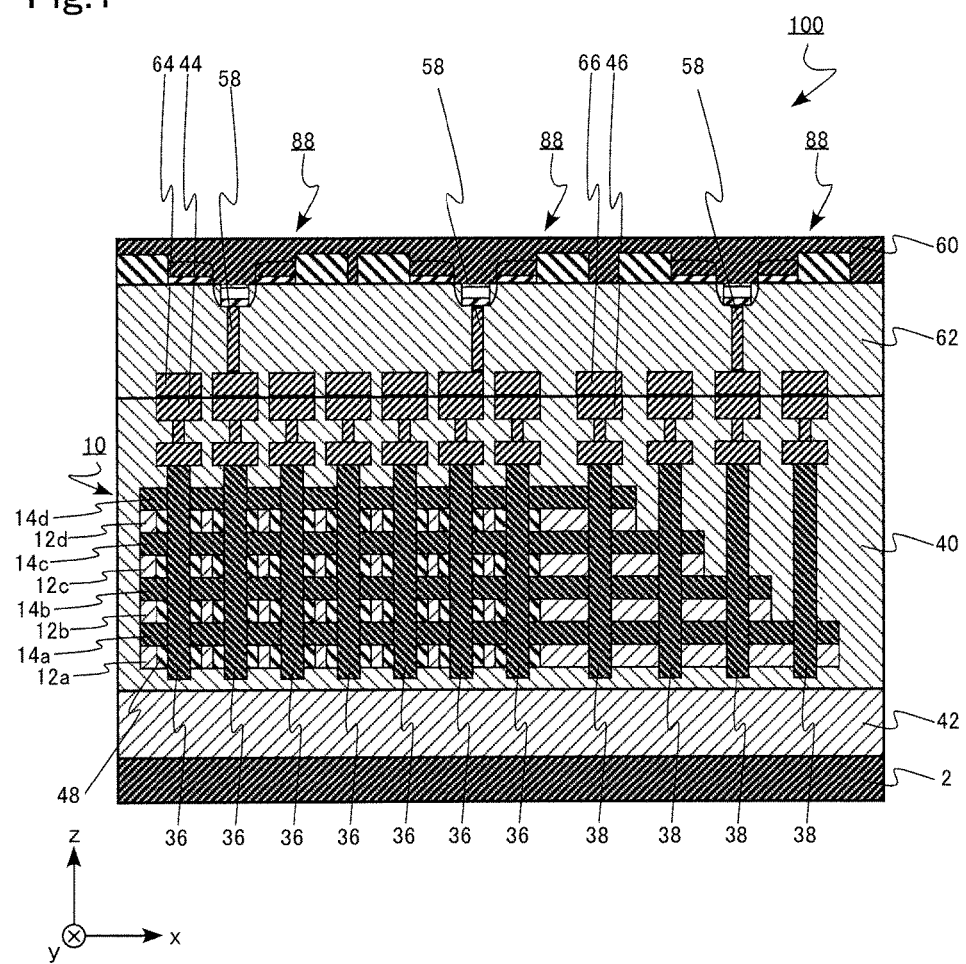
FIG. 1 is a schematic sectional view of a memory device according to an embodiment.

Hereinafter, an embodiment is described with reference to the drawings. Note that in the drawings, the same or similar parts are denoted by the same or similar reference numerals.

A memory device according to an embodiment includes: a stacked film having a plurality of semiconductor films, and a plurality of insulating films each provided between the semiconductor films; a first electrode provided above the stacked film; a second electrode provided above the stacked film; a plurality of first conductive pillars penetrating through the stacked film and having one end electrically connected to the first electrode and another end not connected and positioned below the stacked film; a plurality of memory cells each provided between each of the first conductive pillars and each of the semiconductor films; a plurality of second conductive pillars electrically connected to each of the semiconductor films and the second electrode; a peripheral circuit board provided above the first electrode and the second electrode; a third electrode provided between the first electrode and the peripheral circuit board, the third electrode electrically connected to the first electrode; a fourth electrode provided between the second electrode and the peripheral circuit board, the fourth electrode electrically connected to the second electrode; and a transistor electrically connected to the third electrode or the fourth electrode, the transistor provided in the peripheral circuit board.

FIG. 1 is a schematic sectional view of a memory device 100 according to this embodiment. In the drawing, an x direction is an example of a first direction, a y direction perpendicularly crossing the x direction is an example of a second direction, and a z direction perpendicularly crossing the x direction and the y direction is an example of a third direction.

The memory device 100 according to this embodiment is a nonvolatile semiconductor memory.

A memory cell board 2 is, for example, a single crystal semiconductor substrate such as a silicon (Si) substrate and a germanium (Ge) substrate, a compound semiconductor substrate such as a gallium arsenide (GaAs) substrate, a gallium nitride (GaN) substrate, and a silicon carbide (SiC) substrate. Note that the memory cell board 2 may also be an insulator board such as a silicon oxide ($SiO_2$) substrate. The memory cell board 2 is provided in parallel to the xy plane.

A second memory cell insulator 42 is provided on the memory cell board 2. It is preferred that the second memory cell insulator 42 contain tantalum oxide or aluminum oxide.

A first memory cell insulator 40 is provided on the second memory cell insulator 42. It is preferred that the first memory cell insulator 40 contain silicon oxide, silicon oxynitride, or carbon-added silicon oxide.

A stacked film 10 is provided in the first memory cell insulator 40. The stacked film 10 includes a plurality of semiconductor films 14 (a first semiconductor film 14a, a second semiconductor film 14b, a third semiconductor film 14c, and a fourth semiconductor film 14d), and a plurality of insulating films 12 (a first insulating film 12a, a second insulating film 12b, a third insulating film 12c, and a fourth insulating film 12d) each provided between the plurality of semiconductor films. The plurality of semiconductor films 14 and the plurality of insulating films 12 constituting the stacked film are provided in parallel to the xy plane.

The plurality of semiconductor films 14 contains, for example, Si or Ge.

The plurality of insulating films 12 contains, for example, silicon oxide or silicon nitride.

Note that the numbers of the semiconductor films 14 and the insulating films 12 illustrated in FIG. 1 are four; however, the numbers thereof are not limited thereto.

An area of one semiconductor film 14 among the plurality of semiconductor films 14 is smaller than an area of the other semiconductor films 14 provided below the one semiconductor film 14.

A plurality of first conductive pillars 36 penetrates through the stacked film 10 in parallel to the z direction. The plurality of first conductive pillars 36 functions as gate electrodes of memory cells 48. In FIG. 1, seven first conductive pillars 36 are illustrated; however, the number thereof is not limited thereto.

The plurality of first conductive pillars 36 contains a conductive body. The plurality of first conductive pillars 36 contains, for example, a conductive poly-silicon, metal, or metal silicide containing impurities. The other ends of the first conductive pillars 36 positioned below the stacked film 10 are not connected to any other first conductive pillars 36. Note that the plurality of first conductive pillars 36 may also not penetrate all of the semiconductor films 14 and the insulating films 12 constituting the stacked film.

The plurality of memory cells 48 is each provided between the plurality of first conductive pillars 36 and between the plurality of semiconductor films 14. The plurality of memory cells 48 is, for example, a plurality of field effect transistors (FETs) each provided between the plurality of first conductive pillars 36 and between the plurality of semiconductor films 14.

By applying a voltage between the first conductive pillars 36 and the semiconductor films 14 and by storing electric charge in the memory cells 48 between the first conductive pillars 36 and the semiconductor films 14, information can be stored.

A plurality of second conductive pillars 38 is each electrically connected to the plurality of semiconductor films 14. The plurality of second conductive pillars 38 contains, for example, a conductive poly-silicon, metal, or metal silicide containing impurities.

A first electrode 44 is provided above the stacked film 10. The first electrode 44 contains copper (Cu). The first electrode 44 is electrically connected to one end of the plurality of first conductive pillars 36.

Note that there are seven first electrodes 44 illustrated in FIG. 1; however, the number thereof is not limited thereto. Further, one first electrode 44 may also be electrically connected to the plurality of first conductive pillars 36.

A second electrode 46 is provided above the stacked film 10. The second electrode 46 contains copper (Cu). The second electrode 46 is electrically connected to the plurality of second conductive pillars 38.

Note that there are four second electrodes 46 illustrated in FIG. 1; however, the number thereof is not limited thereto. Further, one second electrode 46 may also be electrically connected to the plurality of second conductive pillars 38.

A peripheral circuit board 60 is provided above the first electrode 44 and the second electrode 46. The peripheral circuit board 60 is, for example, a single crystal semiconductor substrate such as a silicon (Si) substrate and a germanium (Ge) substrate, a compound semiconductor substrate such as a gallium arsenide (GaAs) substrate, a gallium nitride (GaN) substrate, and a silicon carbide (SiC) substrate. The peripheral circuit board 60 is provided in parallel to the xy plane.

A peripheral circuit insulator 62 is provided between the peripheral circuit board 60 and the first memory cell insulator 40. It is preferred that the peripheral circuit insulator 62 contain silicon oxide, silicon oxynitride, or carbon-added silicon oxide.

A third electrode 64 is provided in the peripheral circuit insulator 62 between the first electrode 44 and the peripheral circuit board 60. The third electrode 64 contains Cu. The third electrode 64 is electrically connected to a transistor 88, for example, by a wiring 58. Further, the third electrode 64 is electrically connected to the first electrode 44.

Note that in FIG. 1, seven third electrodes 64 are illustrated; however, the number thereof is not limited thereto. Further, the plurality of first electrodes 44 may be electrically connected to one of the third electrodes 64, or one of the first electrodes 44 may be electrically connected to the plurality of third electrodes 64. In this way, an aspect of connection is not to be particularly limited.

A fourth electrode 66 is provided in the peripheral circuit insulator 62 between the second electrode 46 and the peripheral circuit board 60. The fourth electrode 66 contains Cu. The fourth electrode 66 is electrically connected to the transistor 88, for example, by the wiring 58. Further, the fourth electrode 66 is electrically connected to the second electrode 46.

Note that in FIG. 1, four fourth electrodes 66 are illustrated; however, the number thereof is not limited thereto. Further, the plurality of second electrodes 46 may be electrically connected to one of the fourth electrodes 66, or one of the second electrodes 46 may be electrically connected to the plurality of fourth electrodes 66. In this way, an aspect of connection is not to be particularly limited.

The transistor 88 is provided in the peripheral circuit board 60. A semiconductor chip is used for driving the memory cell 48. The transistor 88 is electrically connected to the third electrode 64 or the fourth electrode 66. Note that in FIG. 1, three transistors 88 are illustrated; however, the number of the transistors 88 is not particularly limited.

One example of operation of the memory cell 48, for example, is described in U.S. Pat. No. 8,633,535.

Figure 2:
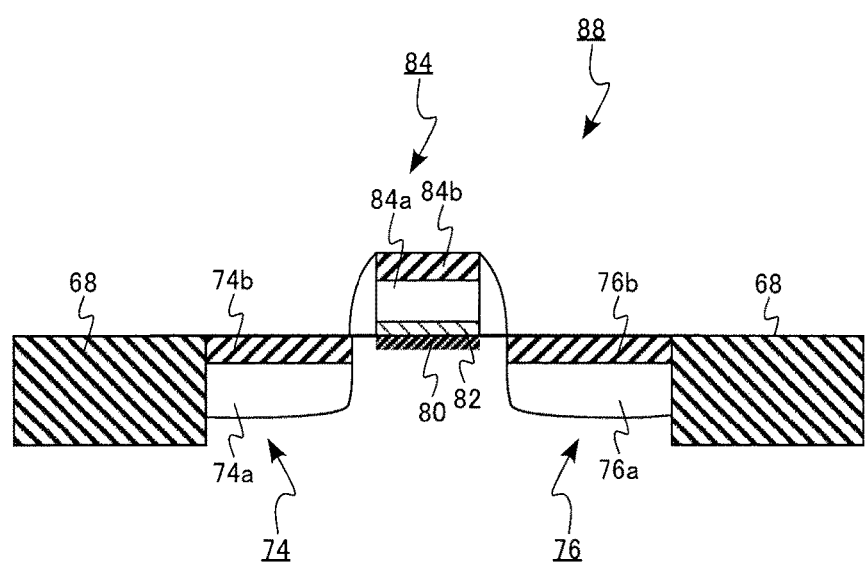
FIG. 2 is a schematic sectional view of a transistor according to an embodiment.

FIG. 2 is a schematic sectional view of the transistor 88. The transistor 88 includes an element isolation region 68, a source portion 74, a drain portion 76, a channel portion 80, a gate insulating film 82, and a gate portion 84.

The element isolation region 68 contains an insulator such as oxide and nitride.

The source portion 74 includes a source region 74a, and a metal silicide portion 74b provided on the source region 74a. The metal silicide portion 74b contains metal silicide. The drain portion 76 includes a drain region 76a, and a metal silicide portion 76b provided on the drain region 76a. The metal silicide portion 76b contains metal silicide.

The channel portion 80 contains a crystalline semiconductor.

The gate portion 84 includes a gate electrode 84a, and a metal silicide portion 84b provided on the gate electrode 84a and containing metal silicide.

The metal silicide is, for example, titanium silicide, aluminum silicide, nickel silicide, cobalt silicide, tantalum silicide, tungsten silicide, or hafnium silicide.

Figure 3:
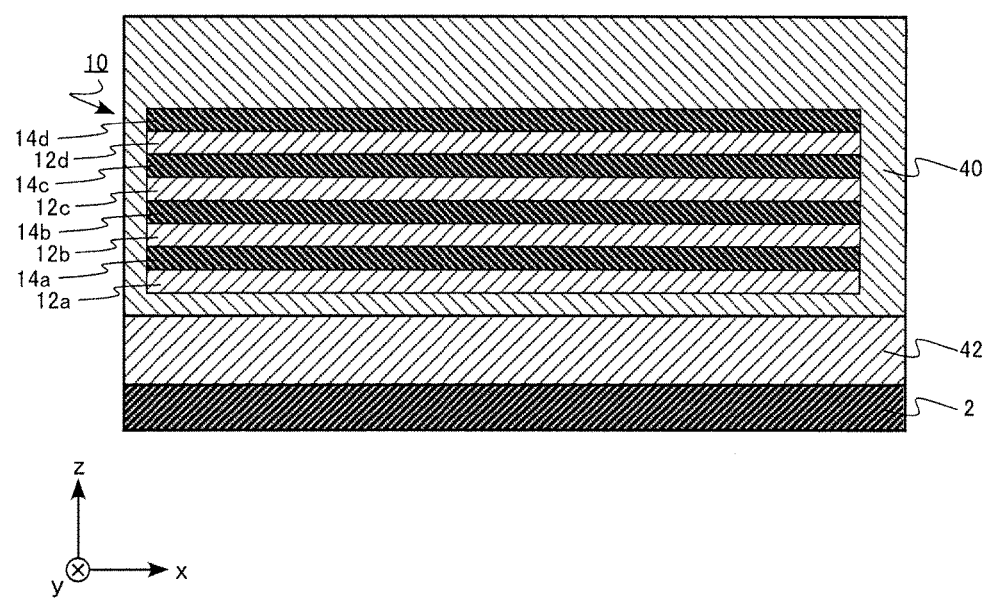
FIG. 3 is a schematic sectional view illustrating a memory device during manufacture by a manufacturing method of the memory device according to an embodiment.
Figure 4:
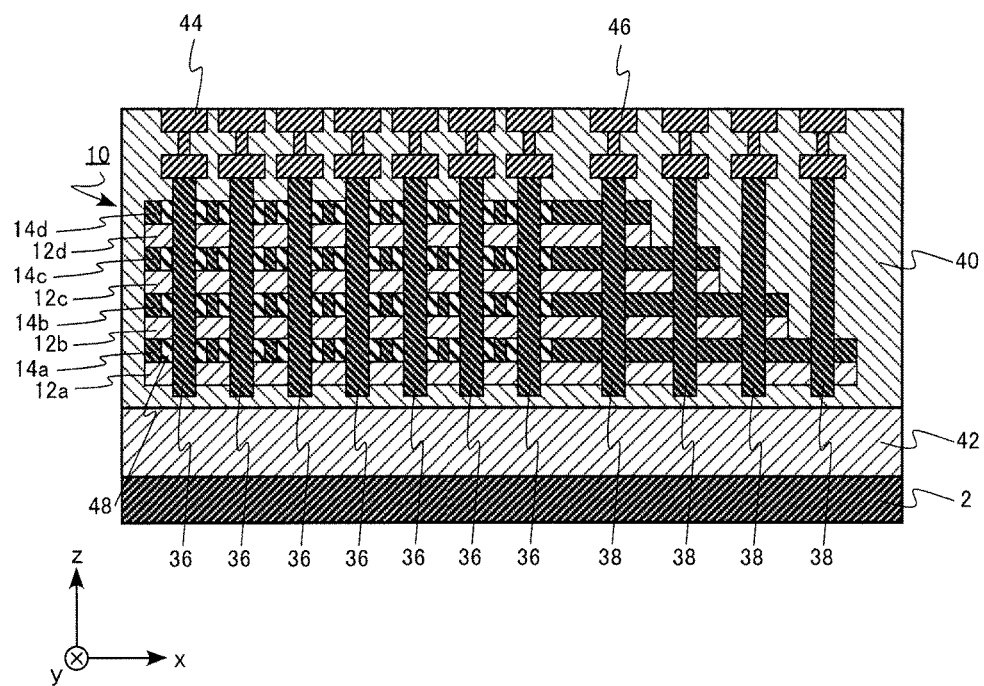
FIG. 4 is a schematic sectional view illustrating a memory device during manufacture by a manufacturing method of the memory device according to an embodiment.

FIGS. 3 and 4 are schematic sectional views illustrating a memory device during manufacture by a manufacturing method of the memory device 100 according to this embodiment.

First, the second memory cell insulator 42 is formed on the memory cell board 2. Next, on the second memory cell insulator 42, there are formed the stacked film 10 having the first insulating film 12a, the first semiconductor film 14a, the second insulating film 12b, the second semiconductor film 14b, the third insulating film 12c, the third semiconductor film 14c, the fourth insulating film 12d, and the fourth semiconductor film 14d, and the first memory cell insulator 40 (FIG. 3).

Next, the plurality of first conductive pillars 36 provided so as to penetrate through the stacked film 10 is formed such that none of the first conductive pillars 36 are connected to the other first conductive pillars 36 below the stacked film 10. Accordingly, the plurality of memory cells 48 is each formed between each of the plurality of first conductive pillars 36 and each of the plurality of semiconductor films 14.

Next, there is formed the plurality of second conductive pillars 38 electrically connected to the first semiconductor film 14a, the second semiconductor film 14b, the third semiconductor film 14c, and the fourth semiconductor film 14d.

Next, there is formed the first electrode 44 provided above the stacked film 10, electrically connected to the plurality of first conductive pillars 36, and containing copper.

Next, there is formed the second electrode 46 provided above the stacked film 10, electrically connected to the plurality of second conductive pillars 38, and containing copper (FIG. 4).

Next, the third electrode 64 containing copper, the fourth electrode 66 containing copper, the transistor 88 electrically connected to the third electrode 64 or the fourth electrode 66 and formed in the peripheral circuit board 60, and the peripheral circuit insulator 62 provided around the third electrode 64 and the fourth electrode 66 are stuck together such that the first electrode 44 and the third electrode 64 as well as the second electrode 46 and the fourth electrode 66 are electrically connected, respectively, and such that the first memory cell insulator 40 and the peripheral circuit insulator 62 comes in direct contact with each other. Accordingly, the memory device 100 of this embodiment is obtained.

Next, a function and an effect of the memory device 100 of this embodiment are described.

In a case where a transistor that controls the memory cell 48 is disposed below the stacked film 10, a wiring that vertically penetrates through the stacked film 10 is provided. Then, the wiring that penetrates through the stacked film 10 below the stacked film 10 is connected to the transistor, whereby a signal that controls the memory cell 48 is transmitted.

However, as in the memory device according to this embodiment, in a case where none of the first conductive pillars are connected to the other first conductive pillars below the stacked film, it is not necessary to provide the wiring below the stacked film 10.

In the memory device 100 according to this embodiment, the transistor 88 that controls the memory cell 48 is provided above the stacked film 10. More specifically, the first electrode 44 and the second electrode 46 are provided above the stacked film 10. Further, the peripheral circuit board 60 having the transistor 88 is provided above the first electrode 44 and the second electrode 46.

In the above-described memory device 100, it is possible to provide the memory device 100 having no wiring for connecting with the first conductive pillars 36 or the second conductive pillars 38 below the stacked film 10. Accordingly, it is possible to provide the memory device 100 that can be easily manufactured at a low cost.

In a case where the plurality of first conductive pillars 36 is a plurality of gate electrodes, it is not necessary to connect the gate electrodes with each other below the stacked film 10. Accordingly, it is possible to provide the memory cell suitable for the memory device 100.

By using the stacked film in which an area of one semiconductor film among the plurality of semiconductor films is smaller than an area of the other semiconductor films provided below the one semiconductor film, electric connection between each of the second conductive pillars 38 and each of the semiconductor films becomes easy.

Since the memory device 100 further includes the first memory cell insulator 40 provided around the first electrode 44 and the second electrode 46 as well as the peripheral circuit insulator 62 provided around the third electrode 64 and the fourth electrode 66, and since the first electrode 44, the second electrode 46, the third electrode 64, and the fourth electrode 66 contain copper, manufacturing of the memory device 100 by sticking the first memory cell insulator 40 and the peripheral circuit insulator 62 together can be made easy.

Since the first memory cell insulator 40 and the peripheral circuit insulator 62 contain silicon oxide, silicon oxynitride, or carbon-added silicon oxide, sticking thereof as described above can be easily performed.

Since the tantalum oxide or the aluminum oxide has a low etching rate, it is preferably used as an etching stopper. Accordingly, by providing the second memory cell insulator 42 containing the tantalum oxide or the aluminum oxide below the stacked film 10, in manufacturing the first conductive pillars 36 and the second conductive pillars 38, it is possible to easily form a hole penetrating through the stacked film 10 and the semiconductor film. Thus, it is possible to provide the memory device 100 that can be easily manufactured at a low cost.

As a comparative example to the method of forming the memory device by disposing the transistor 88 below the memory cell 48, there is a method in which the transistor is formed and the stacked film 10 is formed on the transistor. At this time, since the stacked film 10 is Warped, heat of about 1000° C. is added for stress relief. Accordingly, since the heat of about 1000° C. is also added to the transistor, there is a problem in that a material that can be used in the transistor 88 is limited.

In the memory device 100 according to this embodiment, since the method of sticking is used, it is possible to manufacture the memory device 100 without adding high heat to the transistor 88. Therefore, it is possible to use high-performance transistors that may be inferior in a heat-resisting property such as a transistor having a source portion or a drain portion containing metal silicide, and a transistor having a channel portion having a crystalline semiconductor. This is because forming of a MOSFET with a shallower junction becomes possible since a heating step using a high temperature is not used. Accordingly, it is possible to provide the memory device 100 capable of operating at a higher speed and with lower energy consumption using a MOSFET having a finer gate length.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
    a stacked film having a plurality of semiconductor films, and a plurality of insulating films each provided between the semiconductor films;
    a first electrode provided above the stacked film;
    a second electrode provided above the stacked film;
    a plurality of first conductive pillars penetrating through the stacked film, each of the first conductive pillars having one end electrically connected to the first electrode and another end not connected to the other first conductive pillars, the another end positioned below the stacked film;
    a plurality of memory cells each provided between each of the first conductive pillars and each of the semiconductor films;
    a plurality of second conductive pillars electrically connected to each of the semiconductor films and the second electrode;
    a peripheral circuit board provided above the first electrode and the second electrode;

a third electrode provided between the first electrode and the peripheral circuit board, the third electrode electrically connected to the first electrode;

a fourth electrode provided between the second electrode and the peripheral circuit board, the fourth electrode electrically connected to the second electrode; and a transistor electrically connected to the third electrode or the fourth electrode, the transistor provided in the peripheral circuit board.

2. The memory device according to claim 1, wherein the first conductive pillars are a plurality of gate electrodes.

3. The memory device according to claim 1, wherein an area of one semiconductor film among the semiconductor films is smaller than an area of the other semiconductor films provided below the one semiconductor film.

4. The memory device according to claim 1, further comprising:

a first memory cell insulator provided around the first electrode and the second electrode; and a peripheral circuit insulator provided around the third electrode and the fourth electrode, wherein the first electrode, the second electrode, the third electrode, and the fourth electrode contain copper.

5. The memory device according to claim 4, wherein the first memory cell insulator and the peripheral circuit insulator contain silicon oxide, silicon oxynitride, or carbon-added silicon oxide.

6. The memory device according to claim 4, further comprising:

a second memory cell insulator, wherein the first memory cell insulator is provided between the second memory cell insulator and the peripheral circuit insulator.

7. The memory device according to claim 6, wherein the second memory cell insulator contains tantalum oxide or aluminum oxide.

8. The memory device according to claim 1, wherein the transistor includes a source portion and a drain portion, and the source portion and the drain portion each contains metal silicide.

9. The memory device according to claim 8, wherein the metal silicide includes titanium silicide, aluminum silicide, nickel silicide, cobalt silicide, tantalum silicide, tungsten silicide, or hafnium silicide.

10. The memory device according to claim 1, wherein the transistor includes a channel portion containing a crystalline semiconductor.

* * * * *